US006969896B1

(12) United States Patent
Partain et al.

(10) Patent No.: US 6,969,896 B1
(45) Date of Patent: Nov. 29, 2005

(54) PHOTODETECTOR BIASING SCHEME

(75) Inventors: Larry Dean Partain, Los Altos, CA (US); George Zentai, Mountain View, CA (US); Raisa Pavlyuchkova, Palo Alto, CA (US)

(73) Assignee: Varian Medical Systems Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/639,931

(22) Filed: Aug. 12, 2003

(51) Int. Cl.[7] .............................................. H01L 27/142
(52) U.S. Cl. ......................................... 257/428; 378/29
(58) Field of Search ........................... 257/428; 378/29

(56) References Cited

U.S. PATENT DOCUMENTS 5,051,804 A 9/1991 Morse et al.
5,771,271 A * 6/1998 Iodice ......................... 378/96
6,128,362 A 10/2000 Brauers et al.
6,236,050 B1 * 5/2001 Tumer ................... 250/370.09
6,353,229 B1 * 3/2002 Polischuk et al. ..... 250/370.14
6,480,577 B1 * 11/2002 Izumi et al. .................. 379/40
6,795,525 B2 * 9/2004 Kameshima ............... 378/98.8

* cited by examiner

*Primary Examiner*—Allan R. Wilson
(74) *Attorney, Agent, or Firm*—Blakely, Sokoloff, Taylor & Zafman LLP

(57) ABSTRACT

A photodetector having a semiconductor conversion layer is described. The photodetector is configured to receive x-rays incident on its substrate with the substrate-side contact biased so that the lowest mobility carrier in the semiconductor conversion layer is collected by the substrate side contact.

23 Claims, 6 Drawing Sheets

PHOTODETECTOR BIASING SCHEME

TECHNICAL FIELD

Embodiments of the present invention pertain to the field of photoconductors and more specifically related to semiconductor based detectors.

BACKGROUND

Photodetectors typically have a photoconductive semiconductor material, for examples, silicon (Si) and gallium arsenide (GaAs). Considerations in choosing a semiconductor material for a particular application include its energy gap, which in turn determines the range of wavelengths that can be detected, the time response, and the optical sensitivity of the material. The performance of a photodetector may be judged by various criteria including sensitivity. Sensitivity refers to the current produced by a photodetector with respect to the electromagnetic power. A photodetector with high sensitivity will produce more current for a given intensity of incident radiation than one with a low sensitivity. Sensitivity is affected by several factors including the mobility of the electrons in the material. Semiconductor materials with a higher mobility have a higher sensitivity because the charge carriers can move at a greater speed.

One type of conventional photodetector, illustrated in FIG. 1A, includes a semiconductor material with a pair of contact electrodes on either side of the semiconductor material. The semiconductor material, upon which radiation is incident through the top contact electrode, acts as a direct conversion layer to convert incident radiation to electric currents. A voltage source connected to the electrodes applies a positive bias voltage across the semiconductor material, and current is observed as an indication of the magnitude of incident radiation. When no radiation is present, the resistance of the semiconductor material is high for most photoconductors, and only a small dark current can be measured. When radiation is made incident through the top contact electrode upon the semiconductor material, electron-hole pairs form and drift apart under the influence of a voltage across that region. Electrons are drawn toward the more positively (+) biased contact electrode and holes are drawn toward the more negatively biased (quasi-ground) contact electrode. Formation of electron-hole pairs occurs due to interaction between the incident radiation and the semiconductor material. If the x-rays have energy greater than the bandgap energy of the semiconductor material, then electron-hole pairs are generated in the semiconductor as each photon is absorbed in the material. If a voltage is being continuously applied across the semiconductor material, the electron and hole will tend to separate, thereby creating a current flowing through the photodetector. The magnitude of the current produced in the photodetector is related to the magnitude of the incident radiation received.

After removal of the incident radiation, the charge carriers (electrons and holes) remain for a finite period of time until they either reach the electrodes or recombine. The term "charge carriers" is often used to refer to either the electrons, or holes, or both. The rate at which electrons and holes recombine is called the recombination rate, and is a property of the semiconductor material. The recombination rate limits the response time of the photoconductor. The un-recombined carriers can cause a lingering current due to the excess carriers that remain for a time, even after radiation is removed.

The tradeoff between response time and sensitivity is found in the properties of the semiconductor material itself. The unbound electrons in any semiconductor material have a mean lifetime before they are recombined with a hole. The value of the mean lifetime depends upon the characteristics of the semiconductor material. The faster the rate of recombination, the shorter the response time. Furthermore, the unbound electrons have a mobility figure dependent upon the semiconductor material. Higher mobility materials generally have a greater sensitivity. The resulting tradeoff between response time and sensitivity appears to be a direct result of competing properties (recombination rate vs. electron mobility) of the semiconductor material.

Another type of conventional photodetector is the photodiode, as illustrated in FIG. 1B. A photodiode is composed of a p-doped semiconductor (p-type) material layer and an n-doped semiconductor (n-type) material layer. Light is made incident on the depletion region between the p-type and the n-type material layers, creating electron-hole pairs and thus a current. To control the thickness of the depletion region, a layer of intrinsic (i) material may be inserted between the layer of p-doped semiconductor material and the layer of n-doped semiconductor material. Such a photodiode 100 is termed a "p-i-n" diode for the configuration of semiconductor material in the diode.

In operation of a p-i-n photodiode, a reverse-bias voltage is applied across the photodiode 100 and x-rays are mostly absorbed in the intrinsic region. The electron-hole pairs then separate under the applied electric field and quickly migrate toward their respective poles. The electrons move toward the positive pole and the holes move toward the negative pole. Due to the low recombination rate of the intrinsic region and also due to the high mobility of the intrinsic material, there is little chance that the carriers will recombine before they arrive at the interface with the doped material. The electrons and holes then collect near the respective interface with the doped material. As a result of charge collection, the response of the p-i-n photodiode is capacitivly limited.

One problem with the conventional photodetectors is that they often suffer from poor sensitivity. Photodiode 100 of FIG. 1B may be operated in the avalanche mode of operation. If a large reverse-bias is placed across a photodiode, the free carriers are accelerated to such a high energy that many other electron-hole pairs are created by collision, thus producing a large current for a small amount of incident radiation. Although an avalanche photodiode has increased sensitivity, accurate measurement of the intensity of incident radiation is difficult or impossible, and the response time is only in the nanosecond range. Another problem with conventional photodetectors is that they may have poor radiation hardness.

SUMMARY OF AN EMBODIMENT OF THE INVENTION

An x-ray detection apparatus and method are described. In one embodiment, the method includes providing a photodetector having a semiconductor conversion layer disposed between a first contact and a second contact. The second contact being disposed over a surface of the semiconductor conversion layer opposite that of the first contact. The method also includes receiving x-rays incident through the second contact with respect to the first contact. The method also includes biasing the first contact to collect a lowest mobility carrier in the semiconductor conversion layer.

Other features and advantages of the present invention will be apparent from the accompanying drawings, and from the detailed description, which follows below.

BRIEF DESCRIPTION OF THE DRAWINGS

The present invention is illustrated by way of example and not limitation in the accompanying figures.

DETAILED DESCRIPTION

Figure 1A:
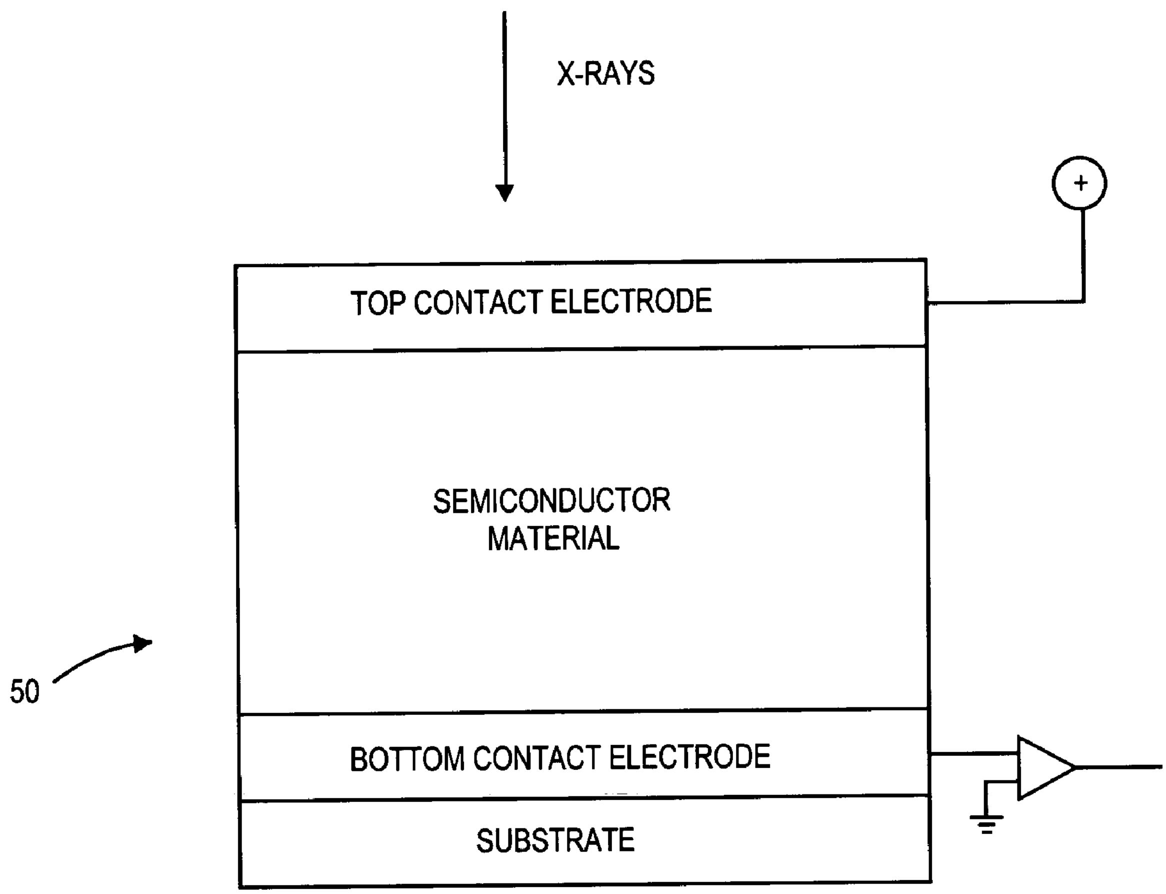
FIG. 1A illustrates one type of conventional photodetector.
Figure 1B:
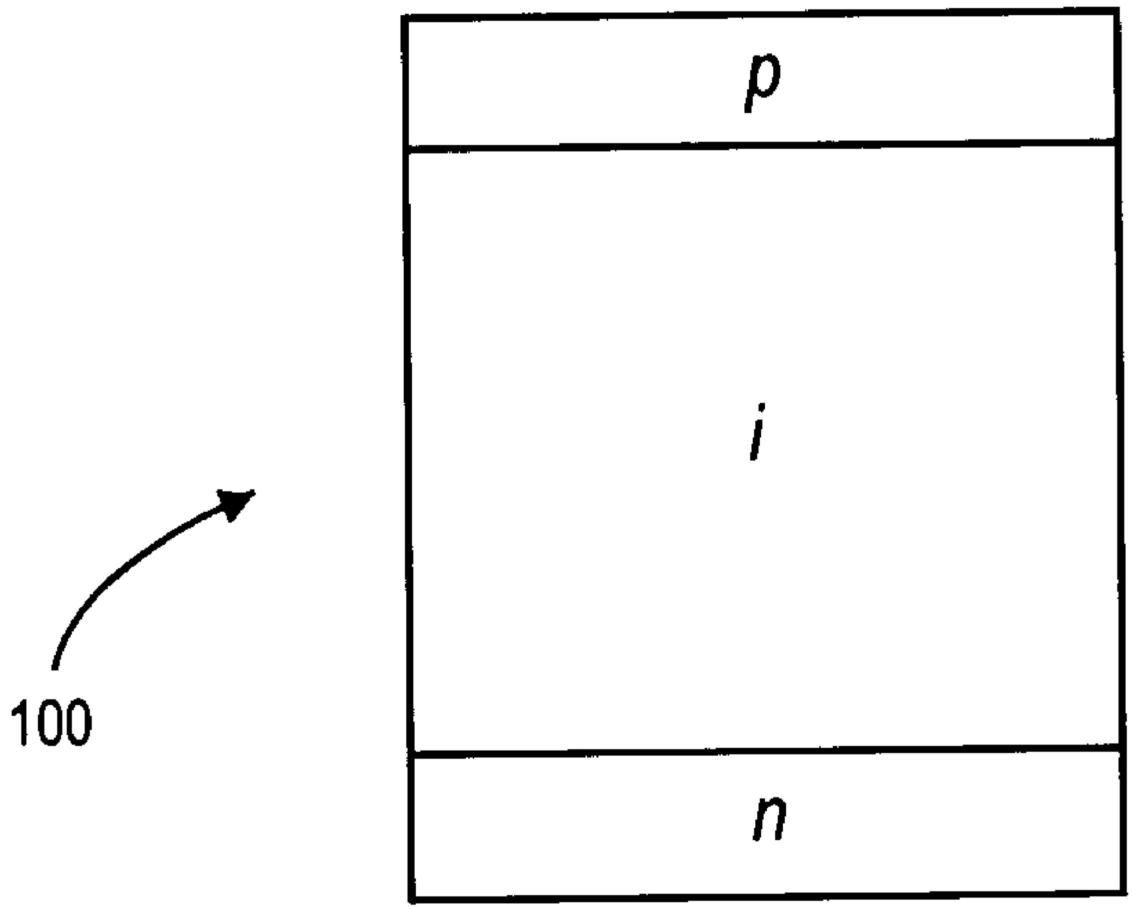
FIG. 1B illustrates one type of conventional photodetector.

In the following description, numerous specific details are set forth such as examples of specific components, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The terms "top," "bottom," "front," "back," "above," "below," "over," and "between" as used herein refer to a relative position of one layer or component with respect to another. As such, one layer deposited or disposed above or below another layer, or between layers, may be directly in contact with the other layer(s) or may have one or more intervening layers. The term "coupled" as used herein means connected directly to or connected indirectly through one or more intervening layers or operatively coupled through non-physical connection (e.g., optically).

A photodetector biasing scheme is described that enables the detection of incident x-rays from either side of a photodetector. The photodectector may be configured to receive incident light (e.g., x-rays) on a particular surface of the detector based on the semiconductor material used for the conversion layer and the particular bias of the conversion layer. Depending on whether the mobility of electrons or holes in the semiconductor material is higher, the semiconductor material may be biased so that the lower mobility carriers are collected at the electrode where the x-ray incidence occurs. Because the x-rays are absorbed exponentially in the semiconductor material, most of the lower mobility carriers are required to travel a shorter distance (the high mobility carriers are collected at the opposite electrode) with such a biasing scheme, thereby improving charge collection.

In one embodiment, the photodetector may be configured to receive x-rays incident on a substrate with the substrate-side contact biased so that the lowest mobility carrier is collected by the substrate side contact. For example, when a high hole mobility semiconductor material is used for the conversion layer and a negative bias is applied to a surface of the conversion layer, the photodetector may be configured to receive incident x-rays on a detector surface opposite that of the negatively biased surface. The receipt of x-rays incident on the detector surface opposite that of the negative bias improves the sensitivity of the photodetector and may also improve the semiconductor material's radiation hardness. For another example, when a high electron mobility semiconductor material is used for the conversion layer and a positive bias is applied to the surface of the conversion layer, the photodetector may be configured to receive x-rays incident on a detector surface opposite that of the positively biased surface (e.g., x-rays received through a substrate).

Figure 2:
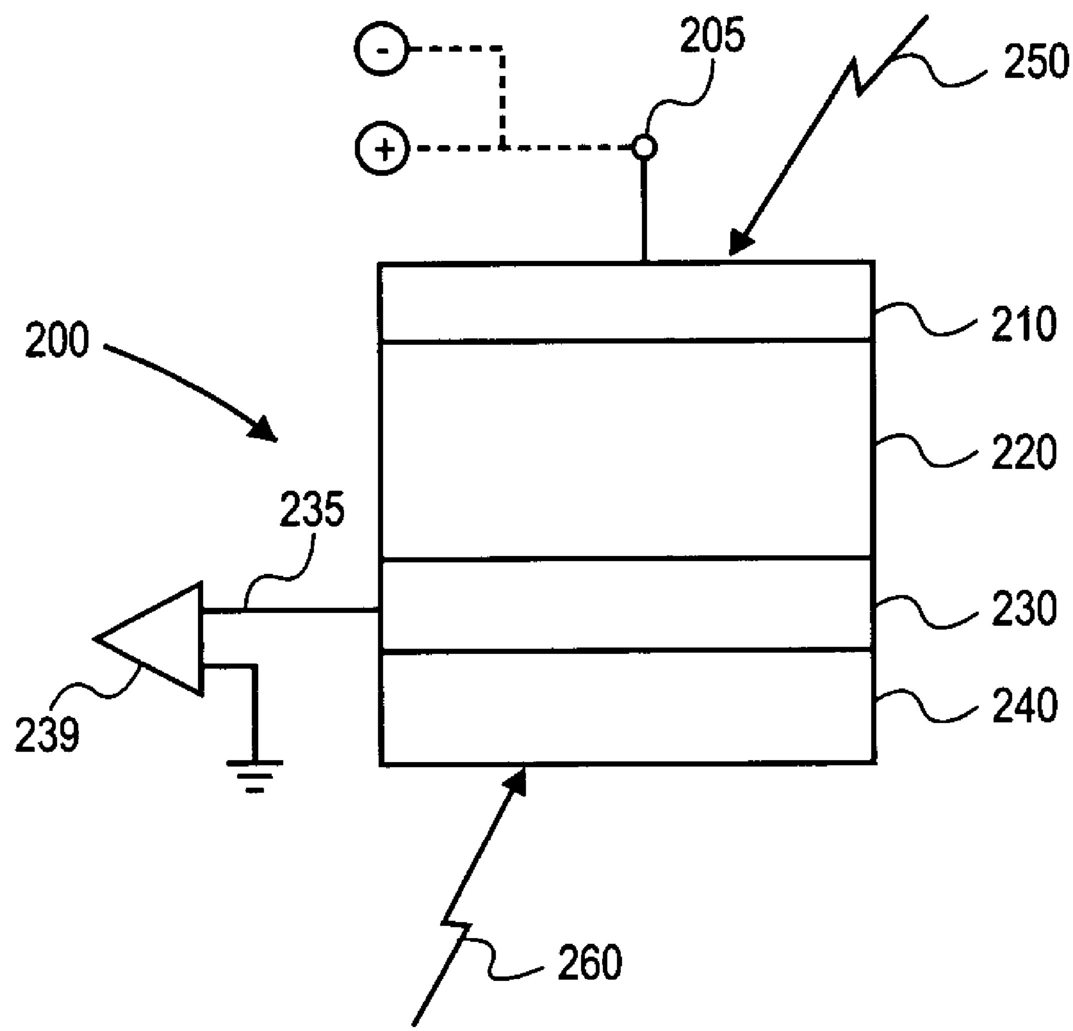
FIG. 2 illustrates one embodiment of a photodetector.

FIG. 2 illustrates one embodiment of a photodetector. In one embodiment, for example, lead iodide ($PbI_2$) may be used for the conversion layer 220 of photodetector 200. Photodetector 200 also includes a first contact 210 (e.g., palladium (Pd)), a second contact 230 (e.g., indium tin oxide (ITO) or Pd), and a substrate (e.g., glass) 240. The first contact 210 is disposed over a first surface of conversion layer 220 and second contact 210 is disposed over a second surface of conversion layer 220 opposite that of the first surface. Second contact 210 is disposed over substrate 240. Alternatively, other conductor materials (e.g., aluminum) and other semiconductor materials (e.g., mercury iodide ($HgI_2$)) may be used for the contact layers and conversion layer, respectively. In another embodiment, conversion layer 220 may be composed of a plurality of different semiconductor material layers. Substrate 240 may be made of other materials that have low attenuation or x-ray absorption, for example, silicon. Materials for making substrates and contacts are well known in the art; accordingly, a detailed description is not provided herein.

Photodetector 200 may be biased in one of two manners with x-rays 250 and 260 incident on either side of the detector. As illustrated in FIG. 2, terminal 205 (of contact 210) may be coupled to either a positive or negative voltage, while conductor 230 may be coupled to a quasi-ground 235 via readout circuitry (e.g., amplifier 239), thus resulting in either a positive or negative bias, respectively. Both front/top incident x-rays 250 and rear/bottom incident x-rays 260 may be detected by detector 200, but with a negative bias applied to contact 210, sensitivity to x-rays 260 will be greater than x-rays 250.

This phenomenon may be explained by electron/hole collection rates in the conversion layer 220. Electrons and holes are generated in pairs when an x-ray strikes and knocks an electron from the crystal lattice, typically near the surface at which the x-ray enters. Collection occurs for an electron when it stops moving through the lattice (such as by filling a hole or by exiting the lattice). Collection occurs for a hole when an electron fills the hole (although the hole may effectively migrate as electrons shift within the lattice). In $PbI_2$ material, holes have much longer collection lengths (take longer to fill) than electrons.

With top incident x-rays 250, electrons are thus collected quickly when the front or first contact 210 is positively biased. Correspondingly, with bottom incident x-rays 260, a negative bias or voltage at the first or front contact 210 reverses the situation, allowing for quick collection at the second or back/bottom contact 230. Moreover, use of Pd for contact 230 may be expected to present a lower barrier to electron collection than use of ITO, thus allowing for greater sensitivity resulting from faster collection with a Pd contact 230.

Figure 3A:
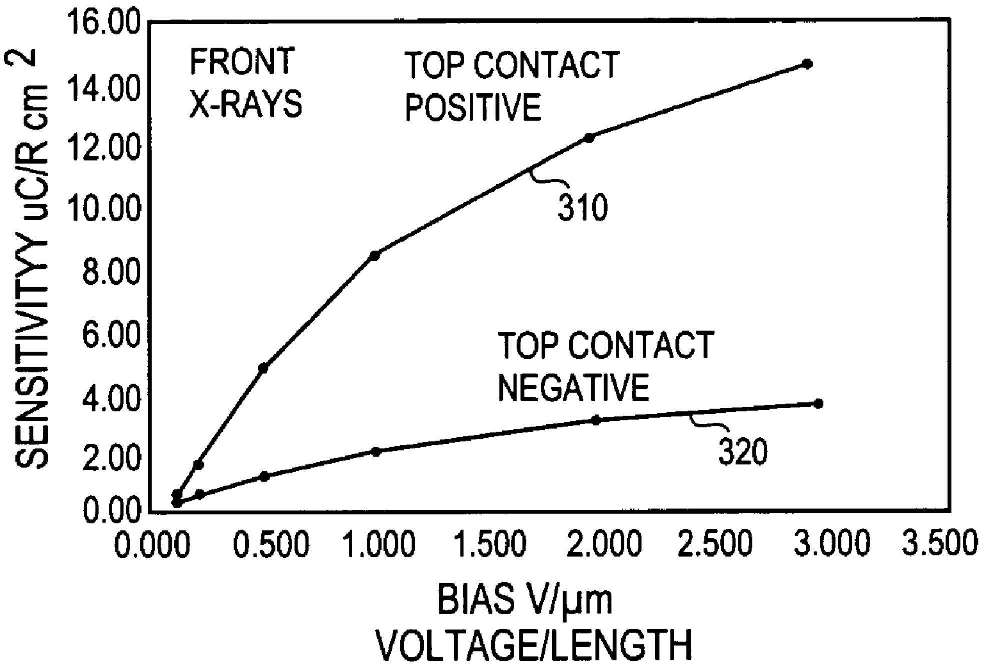
FIG. 3A illustrates sensitivity of one embodiment of the photodetector with top incident x-rays.

FIG. 3A illustrates the x-ray sensitivity of a $PbI_2$ conversion layer with x-rays 250 incident on the top (as illustrated) of detector 200 with both positive and negative top contact bias. The two curves 310 and 320 refer to a positive voltage bias and a negative voltage bias, respectively, applied to the top conductor 210 as a voltage differential between conductors 210 and 230. From the graph, it is apparent that the Top Contact Positive curve 310 illustrates greater sensitivity, thus indicating that for measurement of top incident x-rays 250, a positive bias is preferable and for measurement of bottom incident x-rays 260, and a negative bias is preferable.

Figure 3B:
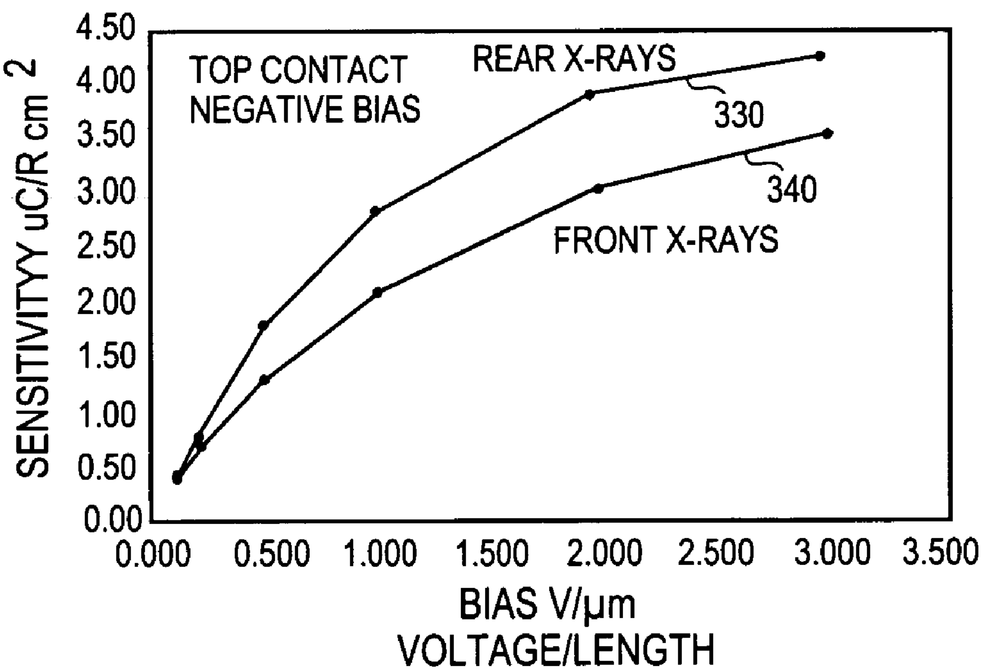
FIG. 3B also illustrates sensitivity of one embodiment of the photodetector having a top contact negative bias.

As bottom incident x-rays 260 may be the phenomena to be detected, a comparison of top and bottom incident x-ray sensitivity is useful. FIG. 3B illustrates the x-ray sensitivity of a $PbI_2$ conversion layer with a top contact 210 negative bias for both bottom incident x-rays 260 and top incident x-rays 250.

Curves 330 and 340 refer to top incident and bottom incident x-rays, respectively, with a negative bias applied to top contact 210. From the curves 330 and 340 of the graph of FIG. 3B, it is apparent that the detector 200 is more sensitive to bottom incident x-rays 260 than to top incident x-rays 250 under a top contact 210 negative bias condition.

Figure 4:
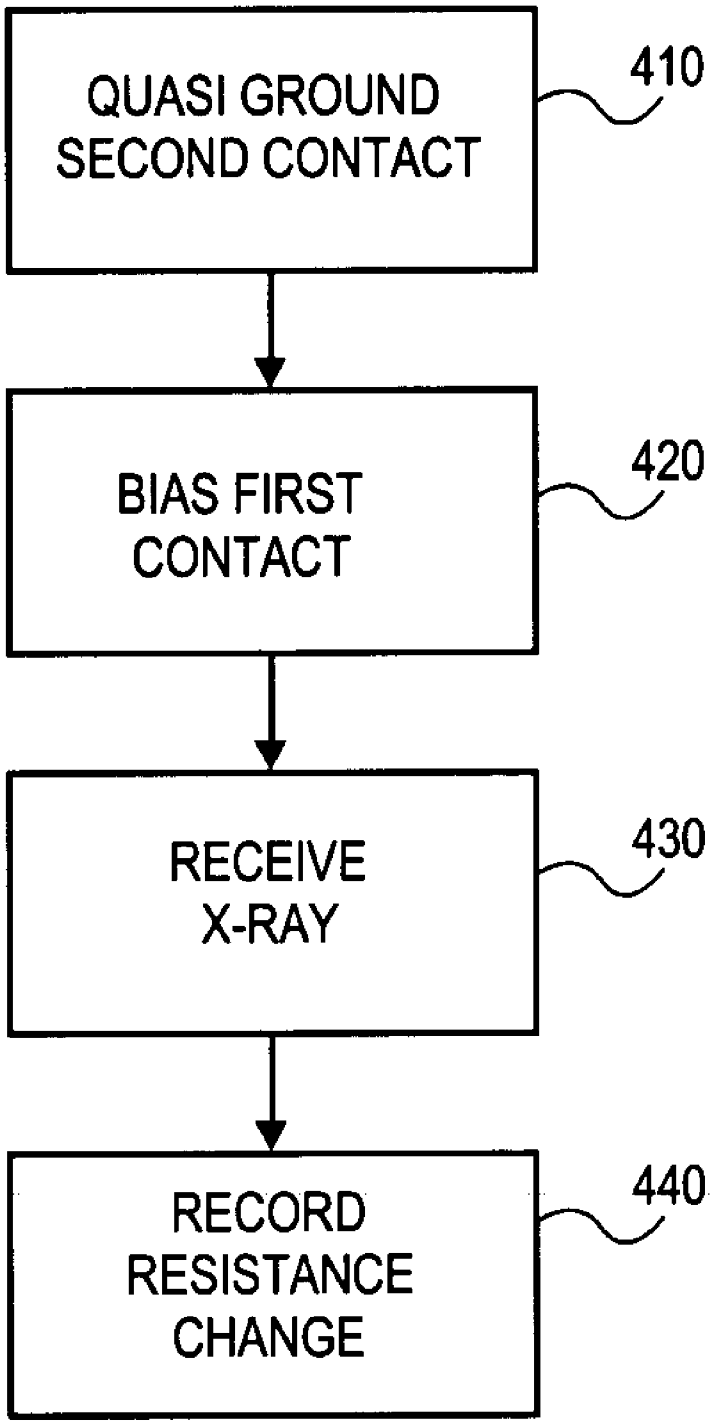
FIG. 4 illustrates an embodiment of a process of operating the detector of FIG. 2.

FIG. 4 illustrates one embodiment of a method of operating photodetector 200. In this embodiment, at step 410, the second contact 230 is coupled to a quasi-ground. At step 420, the first contact 210 is biased to a lower potential (e.g., negative voltage) than second contact 230. At step 430, photodetector 200 is oriented such that x-rays 260 are received incident on substrate 240. It should be noted that the components (e.g., contacts and layers) of photodetector 200 may have x-rays passing through them and, thus, such components receive the x-rays. However, with x-rays incident on substrate 240, the x-rays are initially received through, or incident on, second contact 230 before passing through first contact 210. Alternatively, other biases and x-ray receipt configuration may be used. At step 440, a surrounding system 700 records the change in resistance (as a current or voltage change) and thereby registers the presence of the X-ray. It should be noted that the method steps discussed above may be performed in another order. For example, step 430 may be performed prior to step 420.

In one embodiment, a flat panel x-ray detector 776 may be constructed, for example, as a panel with a matrix of photodetectors 200 with readout electronics to transfer the light intensity of a pixel to a digital signal for processing. The readout electronics may be disposed around the edges of the detector to facilitate reception of incident x-rays on either surface of the detector. The flat panel detector may use, for example, TFT switch matrix coupled to the detectors 200 and capacitors to collect charge produced by the current from detectors 200. The charge is collected, amplified and processed as discussed below in relation to FIG. 5. The choice of bias voltage thus determines the sensitivity of the detector 200. The bias voltage may be configured by system 700 of FIG. 5.

Figure 5:
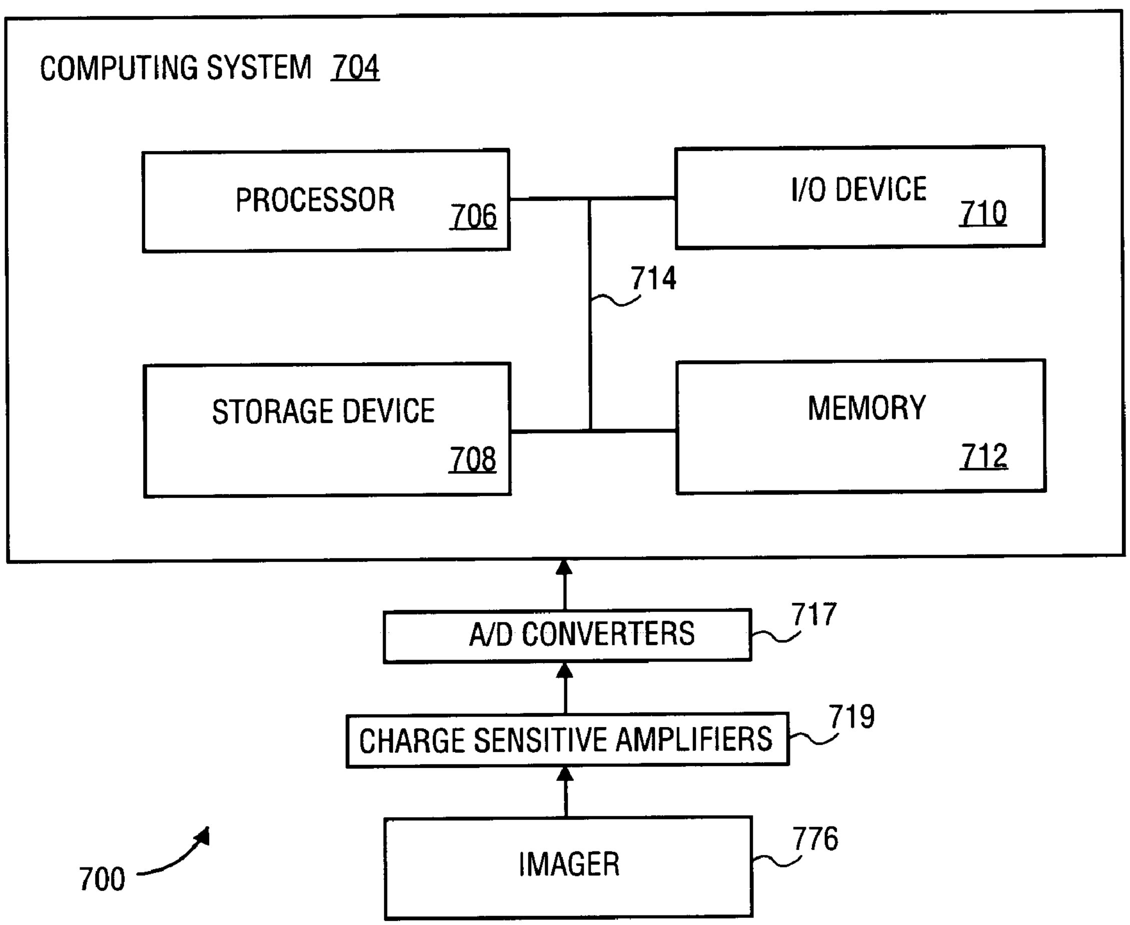
FIG. 5 illustrates an x-ray detection system having an embodiment of the photodetector of FIG. 2.

FIG. 5 illustrates one embodiment of an x-ray detection system. X-ray detection system 700 includes a computing device 704 coupled to a flat panel detector 776. As previously mentioned, flat panel detector 776 may operate by accumulating charge on capacitors generated by pixels of photodetectors 200. Typically, many pixels are arranged over a surface of flat panel detector 776 where, for example, TFTs at each pixel connect a charged capacitor (not shown) to charge sensitive amplifier 719 at the appropriate time. Charge sensitive amplifier 719 drives analog to digital (A/D) converter 717 that, in turn, converts the analog signals received from amplifier 719 into digital signals for processing by computer device 704. A/D converter 717 may be coupled to computing device 704 using, for example, 1/0 device 710 or interconnect 714. A/D converter 717 and charge sensitive amplifiers 719 may reside within computing device 704 or flat panel detector 776 or external to either device. Amplifiers 719 integrate the charges accumulated in the pixels of flat panel detector 776 and provide signals proportional to the received x-ray dose. Amplifiers 719 transmit these signals to A/D converters 717. A/D converters 719 translate the charges to digital values that are provided to computing device 707 for further processing. Although the operation of switch matrix may be discussed herein in relation to a TFT matrix, such is only for ease of discussion. Alternatively, other types of switch devices, such as switching diodes (e.g., single and/or double diodes) may also be used.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. Method, comprising:

providing a photodetector having a semiconductor conversion layer disposed between a first contact and a second contact, the second contact disposed over a surface of the semiconductor conversion layer opposite that of the first contact;

selecting to receive x-rays incident through the first or second contact of the photodetector; and setting the bias for the first contact to be positive or negative with respect to the second contact to collect a lowest mobility carrier in the semiconductor conversion layer at the first contact if the first contact is selected to receive x-rays incident, and to collect a lowest mobility carrier in the semiconductor conversion layer at the second contact if the second contact is selected to receive x-rays incident.

2. The method of claim 1, wherein setting the bias for the first contact relative to the second contact causes the highest mobility carrier in the semiconductor conversion layer to be collected at a location away from a contact selected to receive x-rays incident.

3. The method of claim 1, wherein the semiconductor conversion layer comprises $HgI_2$, and setting the bias comprises:

setting the bias for the first contact to be at a lower potential than the second contact to receive x-rays incident through the first contact; and setting the bias for the first contact to be at a higher potential than the second contact to receive x-rays incident through the second contact.

4. The method of claim 1, wherein the semiconductor conversion layer comprises $PbI_2$, and setting the bias comprises:

setting the bias for the first contact to a higher potential than the second contact to receive x-rays incident through the first contact; and setting the bias for the first contact to a lower potential than the second contact to receive x-rays incident through the second contact.

5. The method of claim 4, wherein biasing comprises quasi-grounding the second contact and applying one of a negative voltage and a positive voltage to the first contact.

6. The method of claim 1, wherein the semiconductor conversion layer comprises a plurality of semiconductor material layers.

7. The method of claim 1, wherein the photodetector further comprises a substrate having a readout circuit coupled to the second contact and wherein the x-rays are received incident on the substrate, the x-rays being incident through the second contact with respect to the first contact.

8. The method of claim 3, wherein the semiconductor conversion layer comprises a plurality of semiconductor material layers.

9. A method, comprising:

selecting a particular semiconductor material for a conversion layer of a photodetector;

determining a bias for the conversion layer; and determining a surface of the conversion layer to receive incident x-rays based on a lowest mobility carrier of the particular semiconductor material selected and the determined bias.

10. The method of claim 9, wherein the semiconductor material comprises $PbI_2$ and the bias is determined to be negative.

11. A photodetector, comprising:

a semiconductor conversion layer having a first surface and a second surface disposed opposite the first surface;

a first contact coupled to the first surface of the semiconductor conversion layer;

a second contact coupled to the second surface of the semiconductor conversion layer;

a substrate having a readout circuit coupled to the second contact, wherein the semiconductor conversion layer is configured to receive x-rays incident on the substrate of the photodetector; and a bias circuit to set the bias for the second contact to be positive or negative with respect to the first contact, to collect at the second contact a lowest mobility carrier in the semiconductor conversion layer.

12. The photodetector of claim 11, wherein the first contact is biased to a lower potential than the second contact.

13. The photodetector of claim 12, wherein the first contact is negatively biased with respect to the second contact.

14. The photodetector of claim 13, wherein the first contact is quasi-grounded and the second contact is coupled to a negative voltage.

15. The photodetector of claim 11, wherein the readout circuit comprising an amplifier having a first input coupled to the negative voltage and a second input coupled to the second contact.

16. The photodetector of claim 11, wherein the semiconductor conversion layer comprises $PbI_2$.

17. The photodetector of claim 11, wherein the semiconductor conversion layer comprises a plurality of semiconductor material layers.

18. The photodetector lf claim 4, wherein the second contact comprises palladium.

19. The photodetector of claim 16 wherein the second contact comprises palladium.

20. The photodetector of claim 13, wherein the second contact comprises palladium.

21. A photodetector, comprising:

means for directly converting x-rays to current, the means for directly converting disposed between a first and a second contact;

means for receiving x-rays incident on a substrate of the photodetector; and means for setting the bias for biasing the second contact to be positive or negative with respect to the first contact, based on direction of x-ray incidence, to collect at the second contact a lowest mobility carrier in the semiconductor material.

22. The photodetector of claim 21, wherein the second contact comprises means for providing a barrier to electron collection.

23. The photodetector of claim 22, further comprising means for providing a signal from the second contact proportional to the received x-rays.

* * * * *